United States Patent
Foster et al.

(10) Patent No.: US 6,624,431 B1
(45) Date of Patent: Sep. 23, 2003

(54) HIGH COLLECTION ANGLE SHORT WAVELENGTH RADIATION COLLIMATOR AND FOCUSING OPTIC

(75) Inventors: Richard M. Foster, Manhattan Beach, CA (US); I. C. Edmond Turcu, Del Mar, CA (US)

(73) Assignee: Jmar Research, Inc., San Diego, CA (US)

( * ) Notice: Subject to any disclaimer, the term of this patent is extended or adjusted under 35 U.S.C. 154(b) by 205 days.

(21) Appl. No.: 09/621,404

(22) Filed: Jul. 21, 2000

Related U.S. Application Data
(60) Provisional application No. 60/145,489, filed on Jul. 21, 1999.

(51) Int. Cl.[7] ............................ G21K 1/02; G01T 1/20; H01J 5/18; G21C 11/00
(52) U.S. Cl. ............................ 250/505.1; 250/504 R; 250/363.1; 250/365; 250/368; 250/369; 250/370.09; 250/372; 378/147; 378/149
(58) Field of Search ................ 250/505.1, 97, 250/108, 378, 504, 559.3, 548; 356/349, 351, 358, 363, 375, 399, 400, 401, 484–490; 359/621, 622, 623, 624, 626; 378/34, 43, 83, 84, 148, 207

(56) References Cited

U.S. PATENT DOCUMENTS

| | | | | |
|---|---|---|---|---|
| 3,947,687 A | * | 3/1976 | Fenstermacher | ............ 250/492 |
| 4,300,055 A | | 11/1981 | Taumann | |
| 5,016,267 A | * | 5/1991 | Wilkins | ................ 378/84 |
| 5,374,974 A | | 12/1994 | Rostoker et al. | .............. 355/71 |
| 5,485,498 A | * | 1/1996 | Waldo, III et al. | ............ 378/84 |
| 5,682,415 A | | 10/1997 | O'Hara | ................ 378/147 |
| 5,724,136 A | * | 3/1998 | Zanoni | ................ 356/349 |
| 5,744,813 A | | 4/1998 | Kumakhov | .............. 250/505.1 |
| 5,926,522 A | | 7/1999 | McCarthy et al. | |
| 5,949,850 A | * | 9/1999 | Tang | ................ 378/154 |
| 5,973,844 A | * | 10/1999 | Burger | ................ 359/622 |
| 6,049,588 A | * | 4/2000 | Cash, Jr. | ................ 378/85 |
| 6,108,397 A | * | 8/2000 | Cash, Jr. | ................ 378/34 |
| 6,271,534 B1 | | 8/2001 | Kumakhov | |
| 6,278,764 B1 | * | 8/2001 | Barbee, Jr. et al. | ........... 378/84 |
| 6,320,658 B1 | * | 11/2001 | Mizutani | ................ 356/399 |
| 6,333,962 B1 | * | 12/2001 | Kitaguchi et al. | ............. 378/57 |
| 6,389,107 B1 | * | 5/2002 | Kantsyrev et al. | .......... 378/245 |

* cited by examiner

*Primary Examiner*—John R. Lee
*Assistant Examiner*—Bernard E. Souw
(74) *Attorney, Agent, or Firm*—William D. McSpadden; Baker & McKenzie

(57) ABSTRACT

The present invention provides a high gain collimator producing generally uniform intensity profiles for use in lithography and other applications. A focusing optic is also provided. The collimator includes a reflector and guide channel. The guide channel preferably includes polycapillary tubes and/or microchannel plates. The polycapillary tubes are used to collimate or focus the central portion of the x-ray beam in a circular, elliptic, square, or rectangular shape. A conical, parabolic resonance reflector or grazing incidence reflector with a shape similar to the polycapillary collimator is used to increase the solid angle collected and produce a circular, square, etc. annular x-ray beam whose inside dimensions are approximately equal to the exit dimensions of the polycapillary collimator. The annular beam shape, intensity profile and collimation angle is adjusted, if necessary, by an absorber, or polycapillary tubes to provide the desired intensity profile at the exit aperture of the hybrid x-ray collimator optic. A focusing optic is obtained by placing two collimating optics end to end.

18 Claims, 2 Drawing Sheets

HIGH COLLECTION ANGLE SHORT WAVELENGTH RADIATION COLLIMATOR AND FOCUSING OPTIC

This application claims priority from U.S. Provisional Application Serial No. 60/145,489, filed Jul. 21, 1999, entitled "High Collection Angle Short Wavelength Radiation Collimator And Focusing Optic", which is incorporated herein by reference in its entirety.

FIELD OF THE INVENTION

This invention relates to an apparatus and method for collecting emitted light, preferably in the x-ray emission spectrum. More particularly, this invention provides a collimator and focusing optic that can collect and direct emitted light, such as in short wavelength radiation lithography and non-lithography operations.

BACKGROUND OF THE INVENTION

In a generally known, x-ray lithography process, the baseline x-ray source is a synchrotron. The synchrotron ultimately produces a collimated x-ray beam from x-rays generated from an accelerated electron beam. When integrated with an advanced x-ray stepper, which includes a mask, resist and wafer such an apparatus, has produced sub-tenth micron transistor gates. Since the synchrotron can produce high power, and high wafer throughput has been possible.

However, there are several disadvantages associated with the use of such a synchrotron based apparatus. For example, known synchotrons are very large, taking up a relatively large amount of space. They also are expensive. Generally the use of a number of steppers is necessary to make them cost effective. There has been some reluctance by industry to adopt a synchotron-based x-ray lithography process because of the high cost and time required to modify current factory designs to accommodate synchrotrons.

In nonlithography applications, such as x-ray tomography, synchrotrons also have been used as the x-ray radiation source. As in x-ray lithography, the synchrotron suffers the disadvantages of high cost and inconvenience. A point x-ray source could be used, but a large collection angle collimator/focusing optic is needed.

For these reasons and others, there is a need for an x-ray source that can be cost effectively used with a single stepper and is similar in size to the current advanced optical stepper light sources, such as a deep ultraviolet excimer laser. Several attempts have been made to develop such a x-ray source including laser plasma, dense plasma focus, and electron beam systems. Although significant x-ray power can be generated from these x-ray point sources, they suffer a disadvantage in that the radiation is emitted into angles of $2\pi$ to $4\pi$ steradians.

Various apparatus have been used to attempt to redirect a point source radiation emission field using x-ray optics to redirect x-rays emitted into a uniform intensity and collimated beam. One example is a polycapillary glass tubes and another is a microchannel plate. Solid angles of 0.048 steradian of 1.1 nanometers laser-plasma radiation have been collimated with polycapillary tubes and produced uniform intensities. However, these apparatus have collimated only a relatively small solid angle of the emitted x-ray field. There is a need for an apparatus that can collimate a greater portion of the x-rays emitted from such a point source and thereby more efficiently collect and collimate the available point-source radiation.

The solid angle that can be collected and collimated also can be enhanced by using a grazing incidence x-ray reflector or a variable thickness x-ray resonance coating reflector. Resonance coatings have been developed to increase the x-ray critical reflection angle and for 1.1 nanometer radiation, solid angles of 0.21 steradians can be collimated. This solid angle is approximately four times greater than the polycapillary collimator alone. Collimation is achieved with a conical or parabolic reflector with a variable thickness multi-layer x-ray reflective coating.

However, this apparatus suffers a disadvantage in that it does not achieve a highly collimated x-ray beam in the region of the axis of the collimator. To achieve a highly collimated beam, a beam block typically is used in the central portion of the collimator and consequently a toroidal x-ray beam is produced. A further disadvantage of this apparatus is that during operation, the collimator must be scanned across the wafer to achieve uniform x-ray exposure on the wafer. Scanning is an added complication and reduces the efficiency of the process and increases the cost of the system.

Accordingly, there is a need for an x-ray collimator that achieves a relatively high solid angle collimation and uniform intensity across the entire output aperture.

SUMMARY OF THE INVENTION

The present invention alleviates to a great extent the disadvantages of the known apparatus and methods for collimating short wavelength light, such as radiation in the x-ray spectrum or light with wavelengths less than about 13 nanometers or other wavelengths that can be suitably reflected and collimated in accordance with the present invention. In particular, the present invention provides a high gain x-ray collimator producing a generally uniform intensity profile. In the present invention, a hybrid reflector (such as a grazing incidence reflector or resonance reflective optic) and guide channel (such as using polycapillary tubes or microchannel plates) is provided. This is of particular utility in x-ray lithography. A focusing optic is also provided for use in non-lithography applications, such as tomography, x-ray photoelectron spectroscopy, x-ray diffraction, x-ray microscopy and x-ray flourescence.

The guide channel can be made of polycapillary tubes, microchannel plates or a combination of polycapillary tubes and microchannel plates. The guide channel collimates or focuses the central portion of the x-ray beam in a desired shape, such as circular, elliptic, square, or rectangular shape. The reflector can be made of any suitable reflective optic that can reflect the particular light (such as x-rays or ultraviolet) in the desired fashion. For example, parabolic resonance reflector with a shape similar to the polycapillary collimator is used to increase the solid angle collected and produce a circular, square, etc. annular x-ray beam whose inside dimensions are approximately equal to the exit dimensions of the polycapillary collimator. The annular beam shape, intensity profile and collimation angle is adjusted, if necessary, by an absorber, or polycapillary tubes to provide the desired intensity profile at the exit aperture of the hybrid x-ray collimator optic.

The reflector may optionally be a focusing optic in order to focus the collimated light to a desired spot. For example, an elliptical profile can be used as a focusing optic; alternatively, a focusing optic is obtained by placing two generally parabolic reflector optics arranged end-to-end, although the reflector optics need not be identical.

It is an advantage of the present invention is that the solid angle of the collected radiation is increased. Another advantage of the present invention is that the amount of collimated power delivered by the collimator is increased due to increasing the solid angle in which radiation is collected. A further advantage of the present invention is that the throughput of exposed wavers in an x-ray lithography process can be increased in that that there is a greater collimated power delivery and that the need for scanning the collimator is reduced because of the greater power delivery.

These and other features and advantages of the present invention will be appreciated from review of the following detailed description of the invention, along with the accompanying figures in which like reference numerals refer to like parts thoughout.

DETAILED DESCRIPTION OF THE INVENTION

Figure 1:
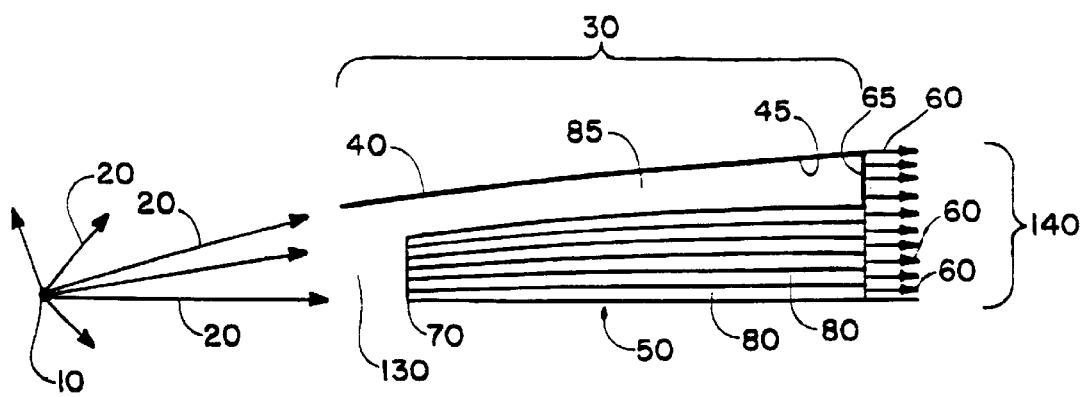
FIG. 1 is a partial cross-sectional side view of an embodiment of a collimator in accordance with the present invention.

In accordance with the present invention, a system is provided for collimating and optionally focusing light, such as preferably light in the x-ray spectrum or light with wavelengths less than about 13 nanometers. Other wavelengths of light also can be collimated or optionally focussed in accordance with the present invention, as well, so long as the light is within the reflective or collimating range of the reflector or guide channel. In this description, the term "light" will be used synonymously with the term "radiation" to refer to the wavelengths that are collimated and/or focused in the present invention, for example, in the x-ray spectrum or in wavelengths less than about 13 nanometers.

As illustrated in FIGS. 1–5, a source 10, such as an x-ray or other light source is provided. The figures illustrate an x-ray source, such as would be used in an x-ray lithography system in which a plasma target, located approximately at the point indicated by source 10 is excited by a beam source, such as a high energy laser, electron beam, proton beam or photon beam. The source 10 emits light in the desired wavelengths. In the figures, the emitted light is depicted diagrammatically with arrows 20.

Light, such as x-rays, emitted from the source 10 is collected by the collimator 30. The collimator includes a reflector apparatus 40 and a guide channel apparatus 50.

Figure 2:
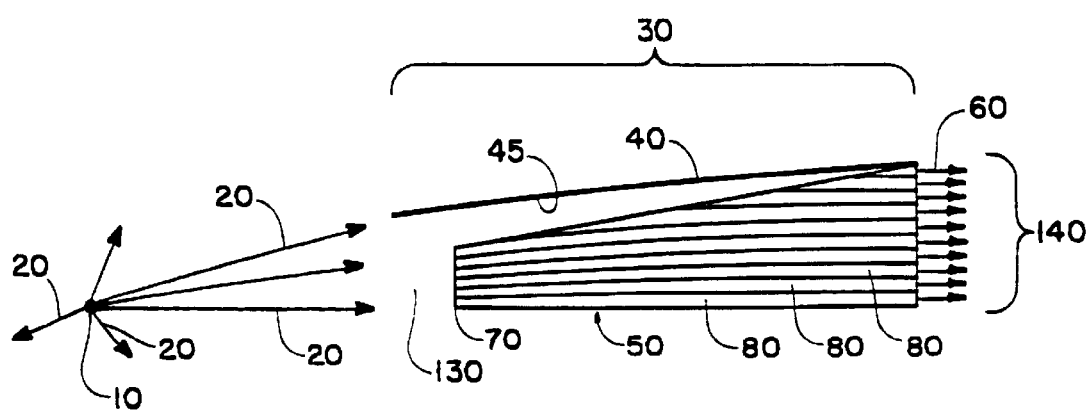
FIG. 2 is a partial cross-sectional side view of another embodiment of a collimator in accordance with the present invention.
Figure 3:
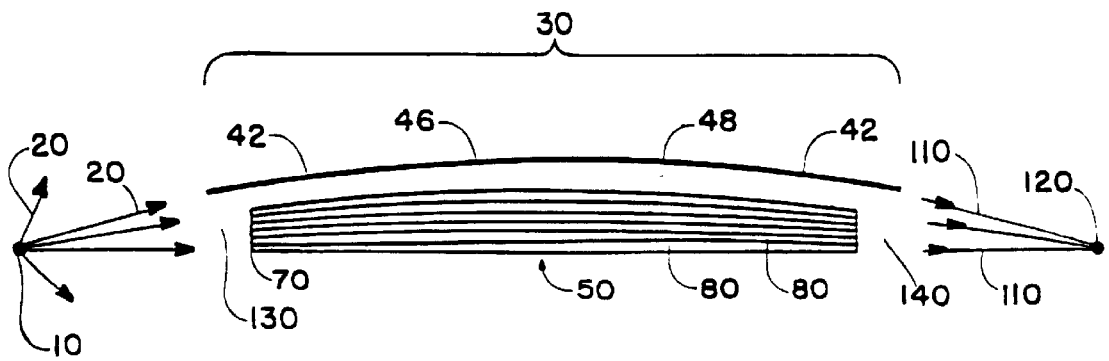
FIG. 3 is a partial cross-sectional side view of an embodiment of a collimator and focusing optic combination, in accordance with the present invention.

The reflector serves to gather and reflect in a desired fashion the light 20 from the source 10 that is outside the guide channel 50, but still within the reflector 40, such in the region between the guide channel 50 and the reflector 40, as illustrated in FIGS. 1–3. Any suitable reflector can be used that can reflect the light 20 from the source 10. In the preferred embodiment, the reflector 40 is adapted to reflect x-rays. In one embodiment, a conical, parabolic resonance reflector or grazing incidence reflector with a shape similar to the guide channel 50 is used to increase the solid angle collected and produce a circular, square, etc. annular x-ray beam whose inside dimensions are approximately equal to the exit dimensions of the polycapillary collimator. It should be understood that any shaped reflector 40 (for example parabolic resonance reflector or grazing incidence reflector) can be used that can achieve collimating and/or focusing the portions of the incoming light that are received and reflected by it. The shape of the exit beam generated can be any shape and does not necessarily need to match the shape of the guide channel 50, although in the preferred embodiment, the exit beam from the reflector 40 does generally match that of the guide channel 50. In the preferred embodiment, a grazing incidence reflector or resonance reflective optic can be used as the reflector 40. The reflector 40 is shaped to reflect light into a collimated orientation. In operation, a portion of the incident light 20 hits the reflective inner surface 45 of the reflector 40 and is reflected in a more linear fashion, i.e. it is collimated. The collimated light exiting collimator 30 is illustrated with arrows 60 in FIG. 1. As illustrated, the exiting light 60 preferably has a substantially collimated profile.

The output beam shape, intensity profile and/or collimation angle can be adjusted, if desired, using an absorber 65. For example, an absorber 65 positioned towards the exit end 140 of the collimator 30 can adjust the intensity profile. In one embodiment, the intensity of the light exiting the collimator 30 close to the reflector 40 at the exit 140 is less intense than that slightly further away from the reflector 40 at the exit 140, but still outside the guide channel 50. Accordingly, in this embodiment, the light intensity gradually increases with distance from the reflector 40. In order to generate a flat intensity profile a graduated absorber may be used. In other words, the absorber 65 absorbs less light close to the reflector. The use of such an absorber 65 is particularly beneficial where it is desired to have a uniform intensity profile in the exiting light 60.

The guide channel apparatus 50 serves to gather and transmit in a collimated fashion light 20 from the light source 10 that reaches the beginning 70 of the guide channel 50. Any suitable guide channel 50 can be used that gather the incoming light 20 and transmit it in a collimated fashion. In the preferred embodiment, the guide channel 50 is adapted to gather and transmit x-rays. In the preferred embodiment, plural guide channel elements 80 are in the guide channel 50. The guide channel elements 80 preferably include polycapillary tubes, or microchannel plates, or a combination of polycapillary tubes and microchannel plates are used in the guide channel apparatus 50. The guide channel collimates or focuses the central portion of the x-ray beam in a desired shape, such as circular, elliptic, square, or rectangular shape. The individual guide channel elements (i.e. polycapillary tubes and/or microchannel plates) are referenced with number 80 in the figures. The polycapillary tubes or microchannel plates 80 are arranged in any pattern to collect incoming light 80 and transmit it to a desired location. The individual polycapillary tubes 80 within the guide channel 50 can optionally be tapered, such as having a changing width over the length of the tube. In addition, the polycapillary tubes 80 can be monolithic such as by being bonded or melted together, or formed within a matrix. As illustrated in FIG. 1, the light 60 exiting the collimator 30 is collimated by the guide channel apparatus 50.

In one embodiment, as illustrated in FIG. 1, there is a gap 85 between the guide channel elements 80 (such as polycapillary tubes or microchannel plates 80) and the reflector 40. In this embodiment, a portion of the exit beam 60 comes from the reflector and a portion from the guide channel 50.

In another embodiment, as illustrated in FIG. 2, the elements 80 of the guide channel 50 extend to the reflector 40. In this embodiment, the exit beam 60 comes from the guide channel 50. In operation, a portion of the incoming light 20 is reflected off the reflector 40 and is received in one or more of the guide channel elements 80, i.e. those which are closer to the reflector 40 and oriented to receive light reflected by the reflector 40.

Any geometry of the polycapillary tubes or microchannel plates 80 can be used. In the embodiment illustrated in FIG. 4, a half of a generally square cross-sectional arrangement of polycapillary tubes 80 is provided. Alternatively, a circular arrangement can be used as indicated by arc 90 in FIG. 4.

One exemplary application of the collimator 30 of the present invention is in x-ray lithography or microlithography. In such lithography operations, the collimated light 60 exiting from the collimator 30 is received by a mask/photoresist on a wafer or other substrate to be processed. In a typical embodiment, the collimated light 60 is directed using directing optics and/or focusing optics to a desired location.

In an alternative embodiment, it is desired to focus the emitted light. This embodiment is illustrated in FIG. 3. In this embodiment, the reflector is shaped as a focusing optic and will be referred to as a "focusing optic 42". Any shape can be selected for the focusing optic 42, which will receive the incoming light and reflect it to a focus location 120. In one embodiment, a generally elliptical cross-sectional shape is used for the focusing optic 42. In a preferred embodiment, the focusing optic 42 includes two generally parabolic reflectors 40 linearly arranged. In the embodiment where two reflectors 40 are used, the reflectors optionally may have the same profile, or alternatively may have different profiles. The upstream reflector portion 46 preferably has the same profile as the downstream reflector portion 48, resulting in a reflection of the light towards a focus point 120. Using a focusing optic 42 is of particular use in non-lithography applications, such as tomography, x-ray photoelectron spectroscopy, x-ray diffraction, x-ray microscopy and x-ray flourescence.

Figure 5:
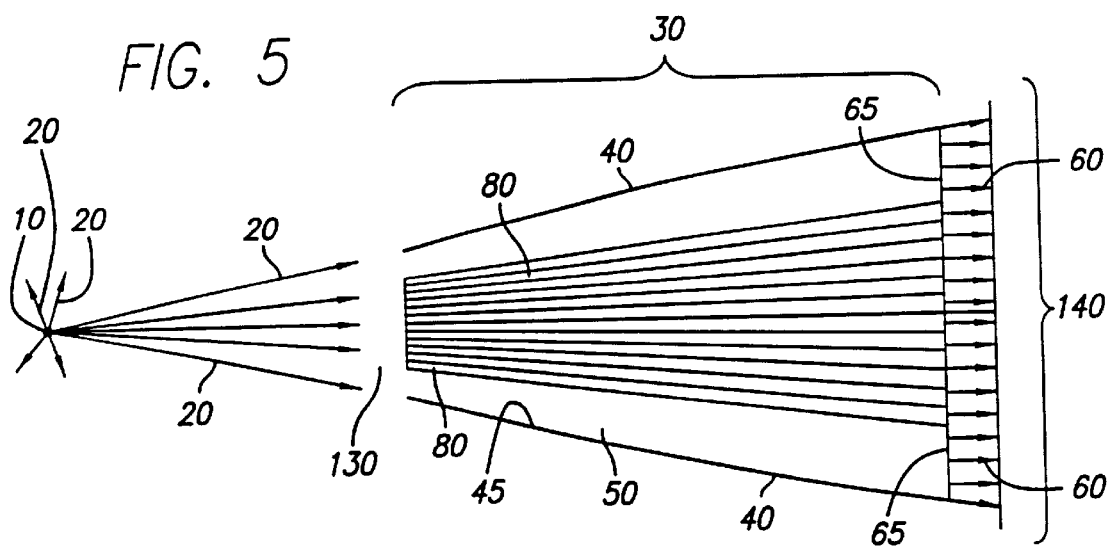
FIG. 5 is a cross-sectional side view of an embodiment of a collimator in accordance with the present invention.
Figure 4:
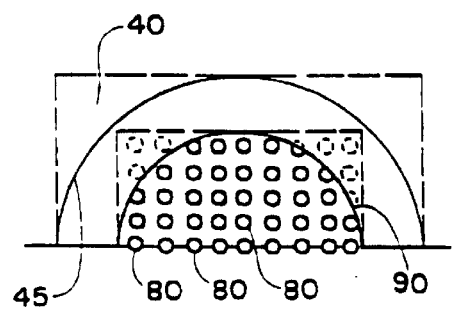
FIG. 4 is a partial cross-sectional end view of a collimator in accordance with the present invention.

It should be noted that, for ease of illustration and discussion, FIGS. 1–4 illustrate a cross-section of a top portion of collimators in accordance with the present invention. A full cross-section of the embodiment illustrated in FIG. 1 is shown in FIG. 5.

In operation, incident light 20, such as x-rays, is received by the collimator, such as through an aperture 130. A portion of the incident light 20 is reflected off reflector 40 and exits via exit aperture 140. Another portion of the incident light 20 is received within and guided through the guide channel and exits via exit aperture 140. The intensity of the exiting light 60 can be adjusted such as by absorber 65, which preferably is positioned at or near the exit aperture 140. In the x-ray embodiment, the exit light can be used for x-ray lithography, such as in the manufacture of integrated circuits and other electronic components.

Thus, it is seen that an apparatus and method for collimating light, such as x-rays or other wavelengths is provided. One skilled in the art will appreciate that the present invention can be practiced by other than the preferred embodiments, which are presented in this description for purposes of illustration and not limitation. It is noted that various equivalents for the particular embodiments discussed in this description may practice the invention as well.

What is claimed is:

1. A collimator comprising:
   a guide channel having a longitudinal front end, a longitudinal back end, and an outer wall, wherein the guide channel is adapted to collimate light received at the longitudinal front end and transmit collimated light from the longitudinal back end;
   a reflector having a generally tapered cylindrical shape wherein the reflector is positioned so that an inner surface of the reflector surrounds a portion of the outer wall of the guide channel and the reflector is coaxial with the guide channel; and
   an absorber disposed at the back opening of the reflector and adapted to pass light reflected by the reflector at a substantially uniform intensity profile.

2. A collimator in accordance with claim 1 wherein said guide channel comprises a plurality of polycapillary tubes.

3. A collimator in accordance with claim 1 wherein the guide channel comprises a plurality of microchannel plates.

4. A collimator in accordance with claim 1 wherein said guide channel comprises at least one polycapillary tube and at least one microchannel plate.

5. A collimator comprising:
   a guide channel having a longitudinal front end, a longitudinal back end, and an outer wall, wherein the guide channel is adapted to collimate light received at the longitudinal front end and transmit collimated light from the longitudinal back end;
   a reflector having a generally tapered cylindrical shape with a front opening and a back opening wherein the reflector is positioned so that an inner surface of the reflector surrounds a portion of the outer wall of the guide channel and the reflector is coaxial with the guide channel, and wherein the reflector is positioned so that light reflected from an inside surface of the reflector is directed to the longitudinal front end of the guide channel.

6. A collimator in accordance with claim 5, wherein the back opening of the reflector is adjacent to the longitudinal front end of the guide channel.

7. A collimator in accordance with claim 5 wherein the guide channel comprises a plurality of polycapillary tubes.

8. A collimator in accordance with claim 5 wherein the guide channel comprises a plurality of microchannel plates.

9. A collimator in accordance with claim 5 wherein the guide channel comprises at least one polycapillary tube and at least one microchannel plate.

10. A method of collimating light comprising:
    providing a guide channel having a longitudinal front end, a longitudinal back end, and an outer wall;
    providing a reflector having a generally tapered cylindrical shape with a front opening and a back opening wherein the reflector is coaxial with the guide channel; and
    providing an absorber disposed at the back opening of the reflector providing light to be collimated;
    collimating a first portion of the light by reflecting the first portion of the light on an inner surface of the reflector;
    passing the first portion of the light through the absorber so that the first portion of light has a substantially uniform intensity profile; and
    collimating a second portion of the light with a guide channel.

11. A method in accordance with claim 10, further comprising:
    applying the first and second portions of collimated light to a photomask so as to define a pattern in a photoactive substance.

12. A method in accordance with claim 10 wherein the collimated light is used in a process selected from a group consisting of lithography, microlithography, tomography, x-ray photoelectron spectroscopy, x-ray diffraction, x-ray microscopy and x-ray fluorescence.

13. A method of collimating light comprising:
   providing a guide channel having a longitudinal front end, a longitudinal back end, and an outer wall;
   A providing a reflector having a generally tapered cylindrical shape with a front opening and a back opening, wherein the reflector is positioned so that an inner surface of the reflector surrounds a portion of the outer wall of the guide channel and the reflector is coaxial with the guide channel;
   providing light to be collimated;
   reflecting the portion of the light on an inner surface of the reflector so as to substantially collimate the portion of the light;
   receiving the substantially collimated portion of the light at the longitudinal front end of the guide channel; and
   passing a collimated beam of light from the back end of the guide channel.

14. A method in accordance with claim 13, wherein the collimated beam of light has a substantially uniform intensity profile.

15. A method in accordance with claim 13, further comprising:
   applying the collimated beam of light to a photomask so as to define a pattern in a photoactive substance.

16. A method in accordance with claim 13 wherein the collimated beam of light is used in a process selected from a group consisting of lithography, microlithography, tomography, x-ray photoelectron spectroscopy, x-ray diffraction, x-ray microscopy and x-ray fluorescence.

17. A method of focusing light on a target point comprising:
   providing a guide channel having a longitudinal front end and a longitudinal back end;
   providing a reflector having a generally tapered cylindrical shape with a front opening for receiving light and a back opening for transmitting reflected light, wherein the reflector is positioned so that it is coaxial with the guide channel;
   providing light to be collimated;
   reflecting a first portion of the light on an inner surface of the reflector so as to focus the first portion of light on a target point outside of the back opening of the reflector; and
   receiving a second portion of the light at the longitudinal front end of the guide channel and focusing the second portion of light on the target point.

18. A method in accordance with claim 17 wherein the focused light is used in a process selected from a group consisting of lithography, microlithography, tomography, x-ray photoelectron spectroscopy, x-ray diffraction, x-ray microscopy and x-ray fluorescence.

* * * * *

UNITED STATES PATENT AND TRADEMARK OFFICE
CERTIFICATE OF CORRECTION

PATENT NO.     : 6,624,431 B1
DATED          : September 23, 2003
INVENTOR(S)    : Foster et al.

It is certified that error appears in the above-identified patent and that said Letters Patent is hereby corrected as shown below:

Column 7,
Line 9, delete "A".

Signed and Sealed this

Thirtieth Day of December, 2003

JAMES E. ROGAN
*Director of the United States Patent and Trademark Office*